United States Patent
Jung (10) Patent No.: US 7,625,813 B2
(45) Date of Patent: Dec. 1, 2009

(54) METHOD OF FABRICATING RECESS CHANNEL IN SEMICONDUCTOR DEVICE

(75) Inventor: Tae-Woo Jung, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 210 days.

(21) Appl. No.: 11/646,412

(22) Filed: Dec. 28, 2006

(65) Prior Publication Data

US 2007/0254465 A1 Nov. 1, 2007

(30) Foreign Application Priority Data

Apr. 28, 2006 (KR) .................. 10-2006-0038786

(51) Int. Cl.
*H01L 21/00* (2006.01)
(52) U.S. Cl. ............... 438/589; 438/704; 257/E21.176
(58) Field of Classification Search ......... 438/289–291, 438/305, 585–592; 257/E21.176
See application file for complete search history.

(56) References Cited

U.S. PATENT DOCUMENTS

| | | | |
|---|---|---|---|
| 6,476,444 B1* | 11/2002 | Min | 257/330 |
| 6,479,348 B1* | 11/2002 | Kamal et al. | 438/258 |
| 6,682,996 B1* | 1/2004 | Blosse | 438/586 |
| 6,790,779 B2* | 9/2004 | Schermerhorn et al. | 438/690 |
| 2007/0269952 A1* | 11/2007 | Chong et al. | 438/301 |

FOREIGN PATENT DOCUMENTS

| JP | 1002-244325 | 9/2001 |
|---|---|---|
| JP | 2001-244325 | 9/2001 |

* cited by examiner

*Primary Examiner*—Richard A. Booth
(74) *Attorney, Agent, or Firm*—Lowe Hauptman Ham & Berner LLP (57) ABSTRACT

A method of fabricating a recess channel in a semiconductor device includes forming a hard mask pattern over a substrate, etching the substrate using the hard mask pattern to form first recesses, forming an insulation layer over the hard mask pattern and the first recesses, etching the insulation layer to form spacers on sidewalls of the first recesses and on sidewalls of the hard mask pattern, etching the substrate below the first recesses to form second recesses using a sulfur fluoride containing gas mixture, and removing the hard mask pattern and the spacers.

26 Claims, 7 Drawing Sheets

METHOD OF FABRICATING RECESS CHANNEL IN SEMICONDUCTOR DEVICE

CROSS-REFERENCE TO RELATED APPLICATIONS

The present invention claims priority of Korean patent application number 10-2006-0038786, filed on Apr. 28, 2006, which is incorporated by reference herein in its entirety.

BACKGROUND

The present invention relates to a method of fabricating a semiconductor device, and more particularly, to a method of fabricating a recess gate.

As the size of patterns of semiconductor devices in DRAMs has decreased recently, a recess gate process has been introduced to overcome a short channel effect generated by the decreased channel length during a gate formation in a cell region and to improve a refresh characteristic. That is, a channel region is recessed in a certain depth to form a recess channel with a longer channel length. Typically, the recess gate process includes forming a recess channel by etching a recess channel region of a substrate and forming a gate on the recess channel. A bottom portion of the recess channel is generally formed in a ball shape.

Figure 1A:
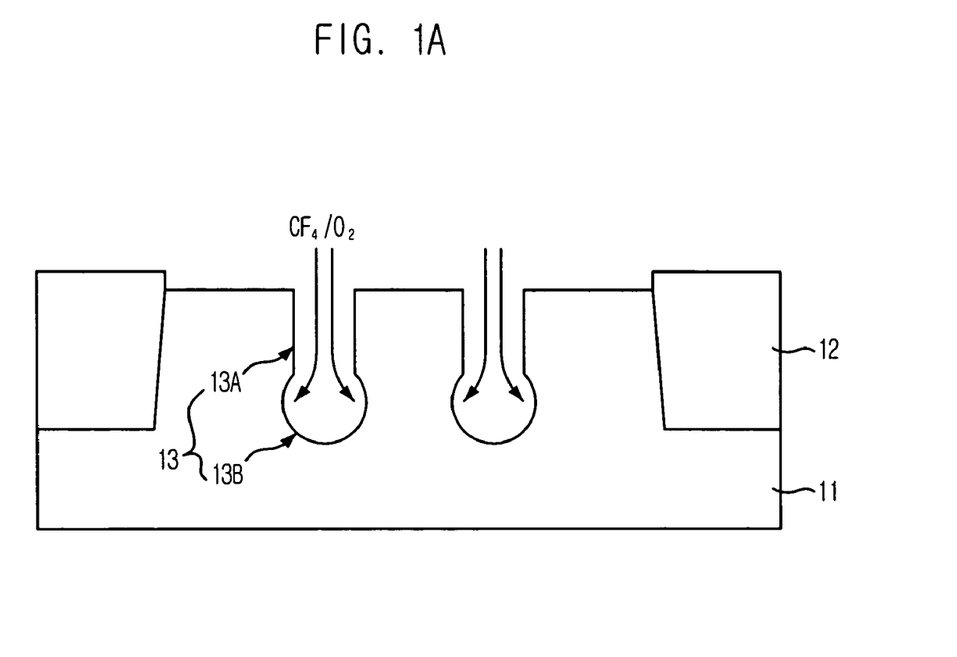
FIG. 1A illustrates a cross-sectional view showing a typical recess gate process.

FIG. 1A illustrates a cross-sectional view showing a typical recess gate process. Device isolation structures 12 are formed in a substrate 11. Recess channels 13 are formed in the substrate 11 by etching certain portions of the substrate 11. Individual recess channel 13 includes a neck pattern 13A and a ball pattern 13B. The recess channels 13 may be referred to as recess gate patterns.

A mixed plasma including tetrafluoromethane ($CF_4$) and oxygen ($O_2$) is generally used to form the ball patterns 13B of the recess channels 13 according to the typical method. However, when forming the ball pattern 13B according to the typical method, polymers formed on a chamber surface may cause a partial failure in forming the rounded shape of the ball patterns 13B. The failure may be generated by incongruity of an etching apparatus and plasma chemistry. Thus, limitations may be generated in characteristics of resultant products and reproducibility may be decreased.

Figure 1B:
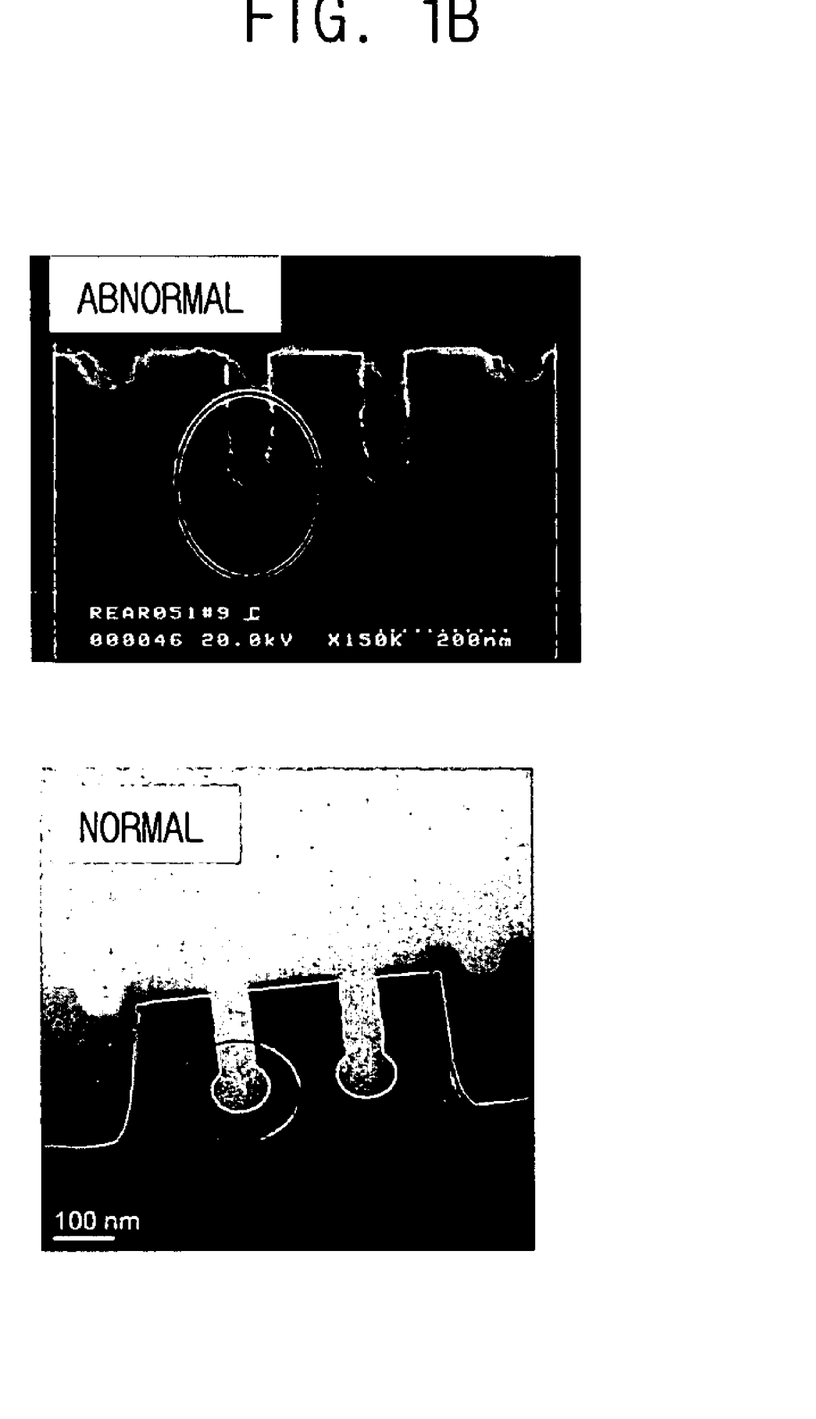
FIG. 1B illustrates micrographic views showing limitations according to the typical method.

FIG. 1B illustrates micrographic views showing limitations according to the typical method. Abnormally formed ball patterns (see 'ABNORMAL') do not have the desired size when compared to normally formed ball patterns (see 'NORMAL').

SUMMARY

Embodiments of the present invention are directed to provide a method of forming a recess channel in a semiconductor device having a ball pattern with high reproducibility.

In accordance with an aspect of the present invention, there is provided a method of fabricating a recess channel in a semiconductor device, including: forming a hard mask pattern over a substrate; etching the substrate using the hard mask pattern to form first recesses; forming an insulation layer over the hard mask pattern and the first recesses; etching the insulation layer to form spacers on sidewalls of the first recesses and on sidewalls of the hard mask pattern; etching the substrate below the first recesses to form second recesses using a sulfur fluoride containing gas mixture; and removing the hard mask pattern and the spacers.

In accordance with another aspect of the present invention, there is provided a method of fabricating a recess channel in a semiconductor device, including: forming a hard mask pattern including an amorphous carbon layer over a substrate; etching the substrate to form a neck pattern using the hard mask pattern; forming an oxide-based layer over the hard mask pattern and the neck pattern; etching the oxide-based layer to form spacers on sidewalls of the neck pattern and sidewalls of the hard mask pattern; etching the substrate below the neck pattern to form a ball pattern using a gas mixture including chlorine ($Cl_2$), hydrogen bromide (HBr), sulfur hexafluoride ($SF_6$), oxygen ($O_2$); and removing the hard mask pattern and the spacers.

DETAILED DESCRIPTION

The present invention relates to a method of fabricating a recess channel having a ball pattern with high reproducibility in a semiconductor device. The shape of the ball pattern may be precisely formed by controlling conditions of an etching process for forming the ball pattern when forming the recess channel including a neck pattern and the ball pattern.

FIGS. 2A to 2F illustrate cross-sectional views showing a method of fabricating a recess channel in accordance with a specific embodiment of the present invention.

Figure 2A:
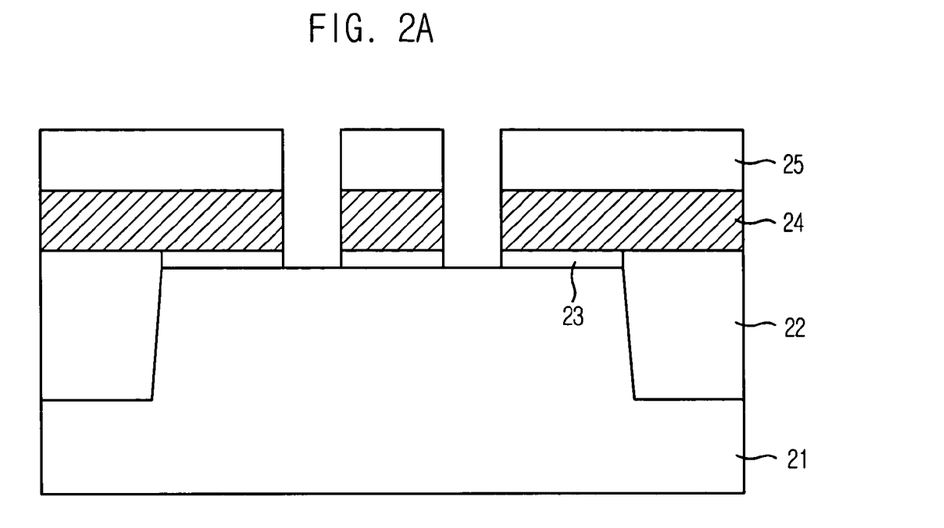
FIGS. 2A to 2F illustrate cross-sectional views showing a method of fabricating a recess channel in accordance with a specific embodiment of the present invention.

Referring to FIG. 2A, device isolation structures 22 are formed in a substrate 21 using a shallow trench isolation (STI) process. The device isolation structures 22 are filled in trenches. The trenches have a depth ranging from approximately 3,000 Å to approximately 4,000 Å.

As it is widely known, the STI process includes forming a pad oxide layer over the substrate 21 using a chemical vapor deposition (CVD) method. The pad oxide layer has a thickness ranging from approximately 100 Å to approximately 300 Å. A pad nitride layer is formed over the pad oxide layer. The pad nitride layer has a thickness ranging from approximately 1,000 Å to approximately 2,000 Å. The pad nitride layer, the pad oxide layer, and the substrate 21 are etched to form the trenches. An insulation layer is formed over the substrate structure and filled in the trenches. A chemical mechanical polishing (CMP) process is performed using a patterned pad nitride layer as a polish stop layer. The patterned pad nitride layer is removed using phosphoric acid ($H_3PO_4$). A patterned pad oxide layer is also removed such that a height difference between the device isolation structures 22 and active regions (not shown) defined by the device isolation structures 22 ranges from approximately 300 Å to approximately 500 Å.

A first hard mask 23, a second hard mask 24, and a recess gate mask 25 are formed over the substrate structure. In more detail, a first hard mask layer is formed over the substrate 21. The first hard mask layer may include an oxide layer. The patterned pad oxide layer used during the above described STI process can be used as the first hard mask layer. Otherwise, an additional oxide layer may be formed as the first hard mask layer after the removal of the patterned pad oxide layer. The oxide layer used as the first hard mask layer may be referred to as a recess gate (RG) oxide layer because the oxide layer is used during a recess gate etching process.

An amorphous carbon layer functioning as a second hard mask layer is formed over the first hard mask layer. The second hard mask layer is formed to overcome potential difficulties related to a case where a subsequent recess gate etching process solely uses a first hard mask layer. The second hard mask layer may include one selected from a group consisting of an amorphous carbon layer, a polysilicon layer, a silicon oxynitride (SiON) layer, and a plasma enhanced (PE) nitride layer.

A photoresist layer is formed over the second hard mask layer. The photoresist layer is patterned by employing photo-exposure and developing processes to form the recess gate mask 25. The second hard mask layer is etched using the recess gate mask 25 as an etch barrier to form the second hard mask 24.

The second hard mask layer is etched in three steps. The three steps include breakthrough etching, main etching, and overetching. The breakthrough etching partially etches surfaces of the second hard mask layer. The main etching substantially etches target portions of the second hard mask layer. The overetching etches residues of the second hard mask layer remaining after the main etching is performed. Portions of the first hard mask layer below the second hard mask layer are etched during the overetching to form the first hard mask 23, exposing portions of the substrate 21.

Figure 2B:
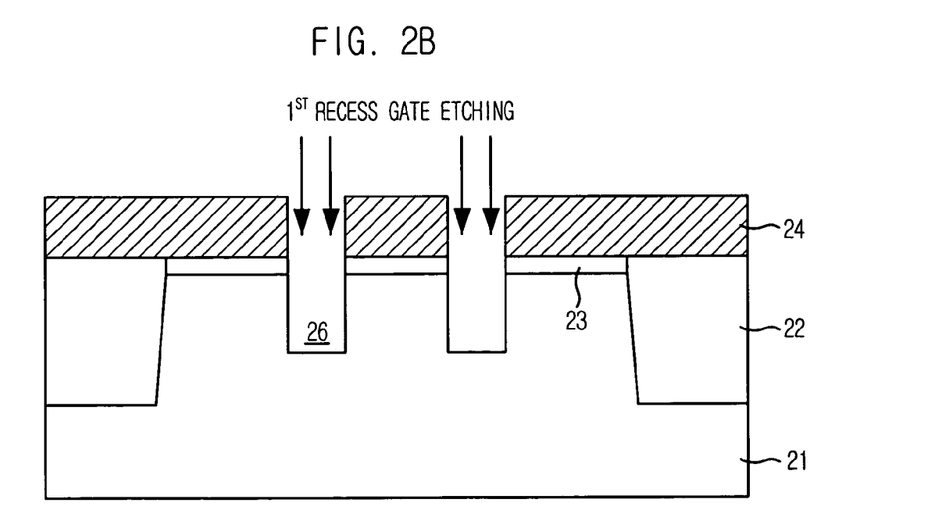

Referring to FIG. 2B, the recess gate mask 25 (FIG. 2A) is removed using a photoresist removal and cleaning process. The cleaning process is performed to remove etch residues. The exposed portions of the substrate 21, i.e., recess gate pattern regions, are partially etched to a certain depth using the second hard mask 24 as an etch barrier. The partial etching is referred to as a first recess gate etching process.

Performing the first recess gate etching process forms first recess patterns 26 of intended recess channels. Hereinafter, the first recess patterns 26 are referred to as neck patterns 26. The depth of the neck patterns 26 ranges approximately ⅔ of a total depth of the intended recess channels. An etch gas used during the first recess gate etching process may include a gas selected alone or in combination with oxygen ($O_2$) from a group consisting of chlorine ($Cl_2$), hydrogen bromide (HBr), sulfur hexafluoride ($SF_6$), and a combination thereof. In other words, a gas selected from a group consisting of $Cl_2$, HBr, $SF_6$, and a combination thereof may be used alone, or $O_2$ may be added to the selected gas for use in the first recess gate etching process. Also, a combined gas of $Cl_2$, HBr, $SF_6$, and $O_2$ may be used.

Using such etch chemistry as described above during the first recess gate etching process allows forming sidewalls of the neck patterns 26 in a vertical shape. In particular, using $Cl_2$ and HBr may obtain the vertical shape more easily. Meanwhile, a portion of the second hard mask 24 including an amorphous carbon layer may be removed during the first recess gate process, and thus, the second hard mask 24 may decrease in thickness.

Figure 2C:
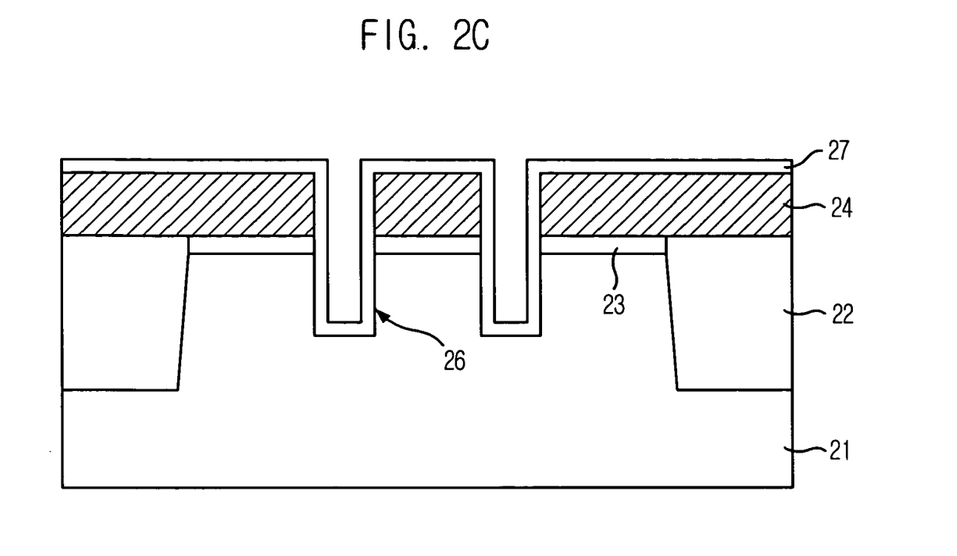

Referring to FIG. 2C, an oxide-based layer 27 is formed over the substrate structure for insulation. The oxide-based layer 27 is referred to as the spacer oxide layer 27 hereinafter. The spacer oxide layer 27 is formed at a temperature ranging from approximately 700° C. to approximately 1,000° C. to prevent deformation of the amorphous carbon layer used as the second hard mask 24. The spacer oxide layer 27 may be formed using one of a furnace method and a CVD method. The spacer oxide layer 27 is controlled to have step coverage ranging from approximately 70% to approximately 100% when forming the spacer oxide layer 27 to obtain even thicknesses of the spacer oxide layer 27 on most surfaces of the substrate structure. That is, the thicknesses of the spacer oxide layer 27 are uniformly formed on top surfaces and sidewalls of the second hard mask 24 and on bottom surfaces and sidewalls of the neck patterns 26. As described above, forming the spacer oxide layer 27 may fundamentally prevent deformation of the second hard mask 24 including the amorphous carbon layer or any other material layer used as the second hard mask 24.

Figure 2D:
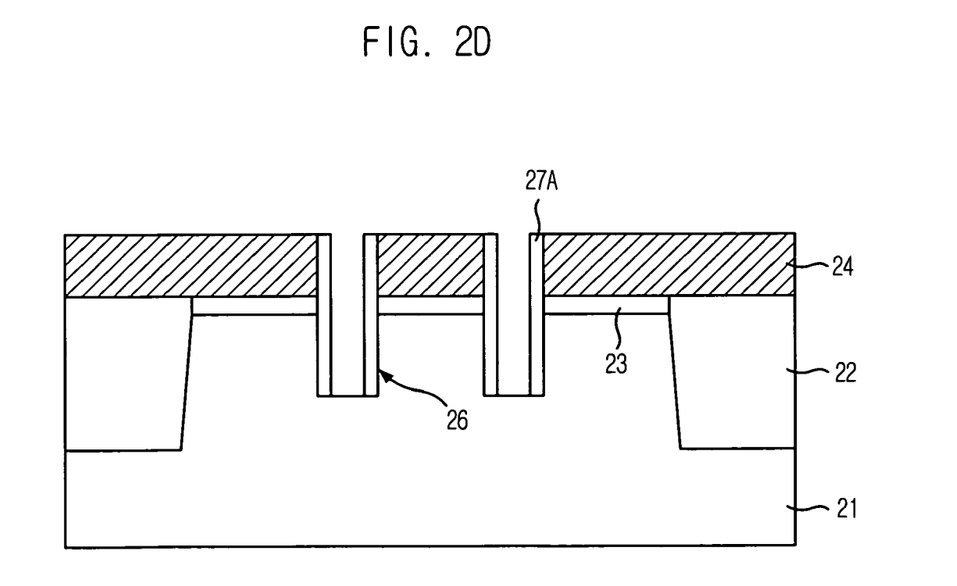

Referring to FIG. 2D, an etching process is performed on the spacer oxide layer 27 to form spacers 27A on the sidewalls of the neck patterns 26. Hereinafter, such etching process is referred to as the spacer etching process. The spacer etching process uses a gas selected from a group consisting of tetrafluoromethane ($CF_4$), $O_2$, helium (He), argon (Ar), fluoroform ($CHF_3$), and a combination thereof.

The bottom surfaces of the neck patterns 26 and the top surfaces of the second hard mask 24 are exposed after the spacer etching process is performed. That is, the spacers 27A are formed in contact with sidewalls of the first hard mask 23 and the second hard mask 24. A certain level of overetching may be performed during the spacer etching process.

Figure 2E:
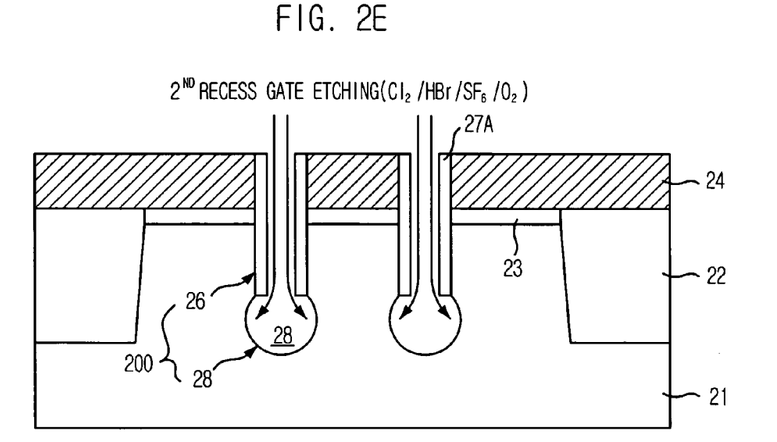

Referring to FIG. 2E, a ball silicon (Si) etching process is performed to form second recess patterns 28 using the spacers 27A and the second hard mask 24 as an etch barrier. The second recess patterns 28 are referred to as the ball patterns 28 hereinafter. The ball Si etching process is referred to as a second recess gate etching process.

The second recess gate etching process uses a gas including $Cl_2$, HBr, $SF_6$, and $O_2$. Using such etch chemistry results in an isotropic etch characteristic. The second recess gate etching process etches to a depth ranging approximately ⅓ of the total depth of the intended recess channels.

In particular, the second recess gate etching process is performed in-situ in the same apparatus used for the spacer etching process. That is the second recess gate etching process and the spacer etching process are performed in the same etch apparatus.

The second recess gate etching process for forming the ball patterns 28 may be performed under the following conditions. A pressure ranging from approximately 20 mT to approximately 50 mT and a chamber temperature ranging from approximately 30° C. to approximately 70° C. are used. A top power is supplied and a bottom power is not supplied. The top power may range from approximately 100 W to approximately 400 W. An etch gas including a plasma of a gas comprising $Cl_2$/HBr/$SF_6$/$O_2$ is used. A ratio of $Cl_2$ gas to HBr gas is approximately 3:1 such that $Cl_2$ gas has a larger quantity than HBr gas in the etch gas. A flow rate of $O_2$ gas ranges from approximately 1 sccm to approximately 20 sccm, and a flow rate of $SF_6$ gas ranges from approximately 3 sccm to approximately 20 sccm. The size of the ball patterns 28 is controlled by an etch time.

$Cl_2$ gas and HBr gas in the etch gas function as an etch gas for silicon and control the size of the ball patterns 28. For instance, the size of the ball patterns 28 may decrease if the quantity of $Cl_2$ gas is large, and the size of the ball patterns 28 may increase when a quantity of HBr gas is large. Thus, using the ratio of $Cl_2$ gas to HBr gas being approximately 3:1 allows securing a sufficient size of the ball patterns 28 while preventing adjacent ball patterns 28 from contacting each other. A flow rate of $Cl_2$ gas may range from approximately 90 sccm to approximately 120 sccm, and a flow rate of HBr gas may range from approximately 30 sccm to approximately 40 sccm.

SF$_6$ gas, which is a sulfur fluoride-based gas, mainly etches sidewalls, contributing largely to controlling of the size of the ball patterns 28. O$_2$ gas functions to remove a polymer generated during etching.

Meanwhile, a post treatment for removing damaged portions may be performed after the second recess gate etching process. The post treatment may include further etching the ball patterns 28 in the substrate 21 in an isotropic manner for a thickness ranging from approximately 50 Å to approximately 100 Å. The post treatment uses a gas including CF$_4$/O$_2$/nitrogen trifluoride (NF$_3$)/He/Ar.

Recess channels 200 including the neck patterns 26 and the ball patterns 28 are formed after the second recess gate etching process is performed. The recess channels 200 refer to the intended recess channels described above. The neck patterns 26 are etched in a perpendicular form, and the ball patterns 28 are etched in a rounded shape due to the isotropic etch characteristic.

Figure 2F:
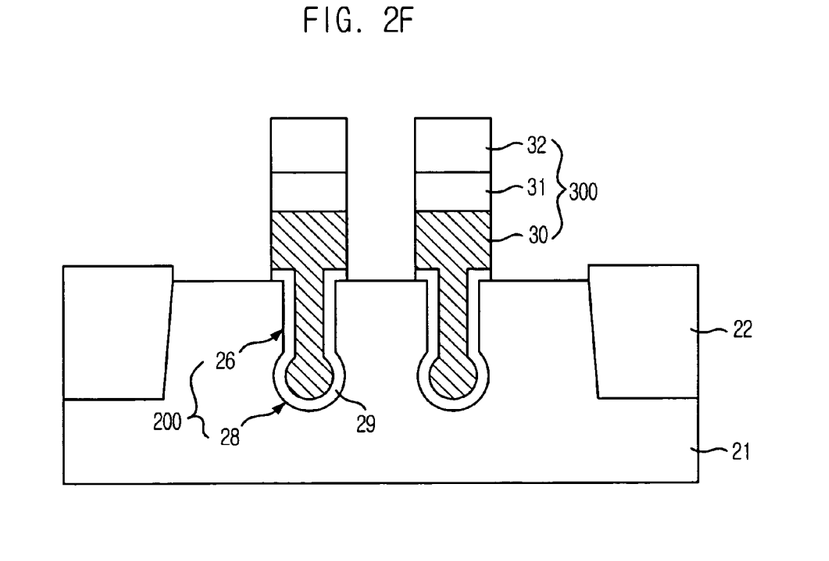

Referring to FIGS. 2E and 2F, the spacers 27A, the first hard mask 23, and the second hard mask 24 are removed. The spacers 27A and the first hard mask 23 are removed by a wet etching process using a buffered oxide etchant (BOE) solution or a hydrogen fluoride (HF) solution. The BOE solution or the HF solution is used because the spacers 27A and the first hard mask 23 include oxide layers. The second hard mask 24 is removed using oxygen because the second hard mask 24 includes an amorphous carbon layer.

Gate oxide layers 29 are formed over surfaces of the recess channels 200 including the neck patterns 26 and the ball patterns 28. Recess gates 300 are formed over the gate oxide layers 29. A bottom portion of the recess gates 300 are filled in the recess channels 200, and the rest of the recess gates 300 are protruded above the substrate structure. Each recess gate 300 may include a polysilicon layer 30, a tungsten silicide layer 31, and a nitride-based hard mask layer 32, formed in sequential order.

Figure 3A:
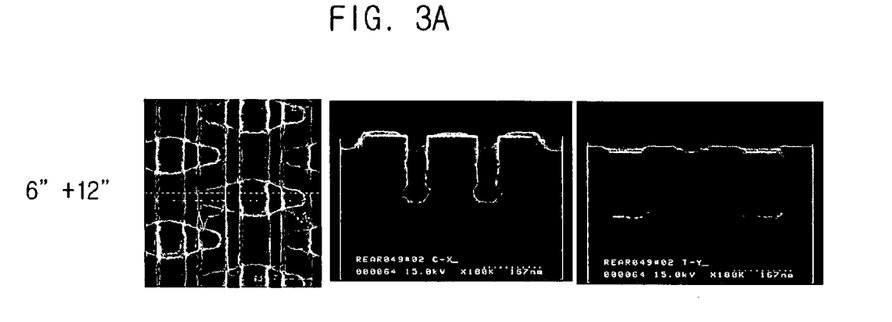
FIGS. 3A to 3C illustrate micrographic views comparing critical dimensions (CD) of ball patterns according to different conditions of an etching process for forming spacers and a second recess gate etching process.
Figure 3B:
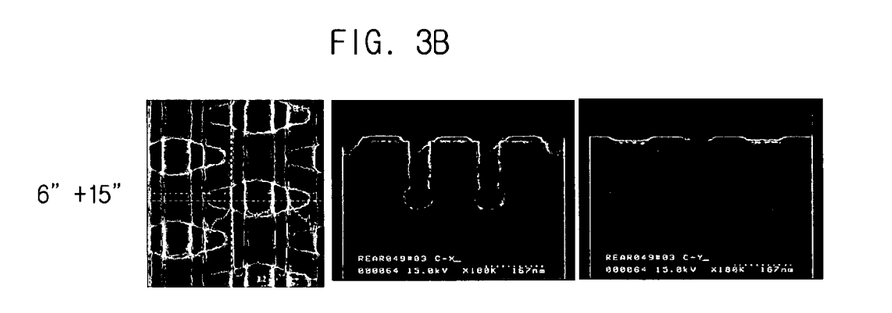
Figure 3C:
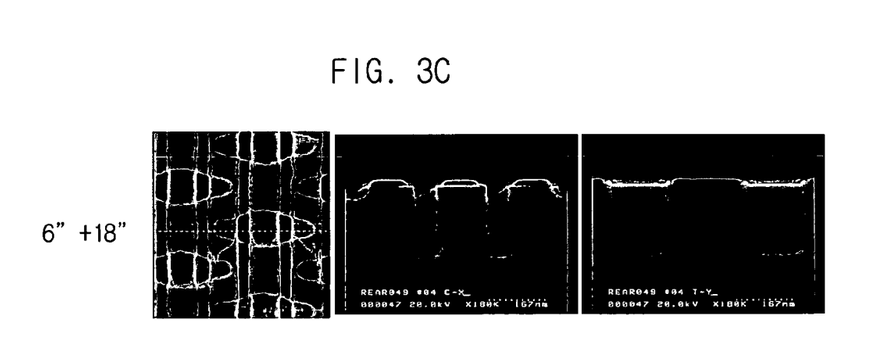

FIGS. 3A to 3C illustrate micrographic views comparing critical dimensions (CD) of ball patterns according to different conditions of a spacer etching process and a second recess gate etching process. The micrographic view on the far left side is a top view. The micrographic view on the far right side is a cross-sectional view in a direction along a minor axis, and the micrographic view in the middle is a cross-sectional view in a direction along a major axis.

Referring FIG. 3A, a spacer etching process is performed under a condition of 20 mT/500 Ws/200 V/80 CF$_4$/50° C./6" [42% overetching]. Also, a second recess gate etching process, i.e., a ball pattern etching, is performed under a condition of 40 mT/400 Ws/OWb/90 Cl$_2$/30 HBr/12 SF$_6$/9 O$_2$/50° C./12".

Referring to FIG. 3B, a spacer etching process is performed under a condition of 20 mT/500 Ws/200 V/80 CF$_4$/50° C./6"[42% overetching]. Also, a second recess gate etching process, i.e., a ball pattern etching, is performed under a condition of 40 mT/400 Ws/OWb/90 Cl$_2$/30 HBr/12 SF$_6$/9 O$_2$/50° C./15".

Referring to FIG. 3C, a spacer etching process is performed under a condition of 20 mT/500 Ws/200 V/80 CF$_4$/50° C./6"[42% overetching]. Also, a second recess gate etching process, i.e., a ball pattern etching, is performed under a condition of 40 mT/400 Ws/OWb/90 Cl$_2$/30 HBr/12 SF$_6$/9 O$_2$/50° C./18".

As described above, differences in the CDs of the ball patterns shown in FIGS. 3A to 3C are resulted from different etching times (12", 15", and 18") of the second recess gate etching processes. Tables 1 to 3 show CDs of the ball patterns shown in FIGS. 3A to 3C in detail.

TABLE 1

| 6" + 12" | B | C | T | Avg |
|---|---|---|---|---|
| Top CD | 62 | 61 | 71 | 65 |
| Neck Depth | 1,330 | 1,362 | 1,275 | 1,322 |
| Depth | 1,852 | 1,916 | 1,833 | 1,867 |
| Ball CD | 83 | 84 | 91 | 86 |
| Ball to Ball CD | 122 | 125 | 115 | 121 |

TABLE 2

| 6" + 15" | B | C | T | Avg |
|---|---|---|---|---|
| Top CD | 61 | 62 | 67 | 63 |
| Neck Depth | 1,288 | 1,330 | 1,256 | 1,291 |
| Depth | 1,884 | 1,948 | 1,905 | 1,912 |
| Ball CD | 88 | 91 | 99 | 93 |
| Ball to Ball CD | 115 | 115 | 109 | 113 |

TABLE 3

| 6" + 18" | B | C | T | Avg |
|---|---|---|---|---|
| Top CD | 66 | 68 | 69 | 67 |
| Neck Depth | 1,288 | 1,362 | 1,267 | 1,302 |
| Depth | 2,001 | 2,097 | 2,012 | 2,037 |
| Ball CD | 101 | 100 | 109 | 103 |
| Ball to Ball CD | 107 | 109 | 108 | 108 |

Referring to Tables 1 to 3, 'Top CD' refers to a CD of neck patterns, 'Neck Depth' refers to a depth of the neck patterns, 'Depth' refers to a total depth of recess channels, 'Ball CD' refers to a CD of the ball patterns, and 'Ball to Ball CD' refers to a distance between adjacent ball patterns. 'B' refers to results measured at a bottom region of a wafer, 'C' refers to results measured at a center region of the wafer, and 'T' refers to results measured at a top region of the wafer. The depth of the neck patterns and the total depth of the recess channels are measured in angstrom (Å) and other parameters are measured in nanometers (nm).

Hereinafter, a set of data identified with 6"+12" shown in Table 1 is referred to as a first example, a set of data identified with 6"+15" shown in Table 2 is referred to as a second example, and a set of data identified with 6"+18" shown in Table 3 is referred to as a third example.

Referring to 'Top CD's shown in the three examples, 'Top CD' in the first example is approximately 65 nm on average, in the second example is approximately 63 nm on average, and in the third example is approximately 67 nm on average. Referring to 'Neck Depths' shown in the three examples, 'Neck Depth' in the first example is approximately 1,322 Å on average, in the second example is approximately 1,291 Å on average, and in the third example is approximately 1,302 Å on average. Referring to 'Depths' shown in the three examples, 'Depth' in the first example is approximately 1,867 Å on average, in the second example is approximately 1,912 Å on average, and in the third example is approximately 2,037 Å on average.

The above described 'Top CDs' and 'Neck Depths' are data of the neck patterns. There is only a slight difference between the data in the first to third examples. 'Depth', which is a total depth of the recess channel, increases as the etch time increases. That is, 'Depth' in the second example is larger than that in the first example, and 'Depth' in the third example is larger than that in the second example.

The CD of the ball patterns, i.e., 'Ball CD', and the distance between adjacent ball patterns, i.e., 'Ball to Ball CD', are examined. Referring to 'Ball CDs' shown in the three examples, 'Ball CD' in the first example is approximately 86 nm on average, in the second example is approximately 93 nm on average, and in the third example is approximately 103 nm on average.

As described above, the distance between adjacent ball patterns, i.e., 'Ball to Ball CD' decreases as the etch time of the second recess gate etching process increases. That is, 'Ball to Ball CD' decreases from approximately 121 nm in the first example to approximately 113 nm in the second example, and to approximately 108 nm in the third example.

Referring to FIGS. 3A to 3C and Tables 1 to 3, the ball patterns in this embodiment are formed with improved precision when a second recess gate etching process is performed under a condition of 40 mT/400 Ws/OWb/90 $Cl_2$/30 HBr/12 $SF_6$/9 $O_2$/50° C.

Figure 4A:
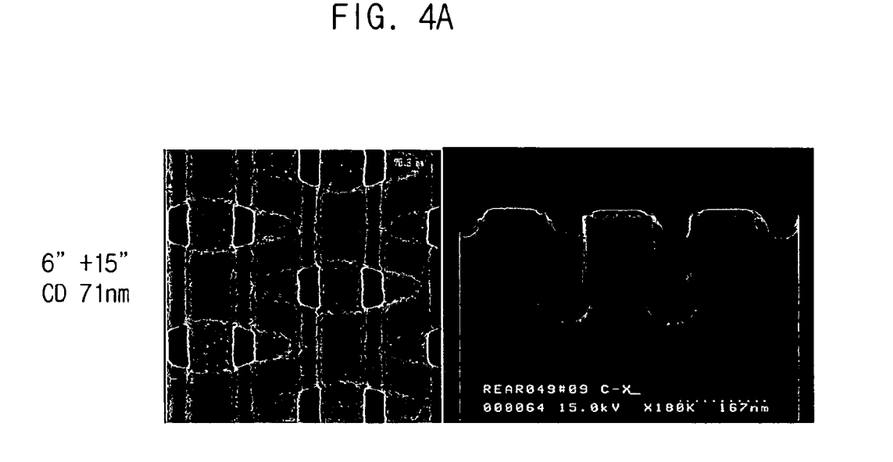
FIGS. 4A and 4B illustrate micrographic views of ball patterns after an etching process for forming spacers and a second recess gate etching process are performed under certain conditions.
Figure 4B:
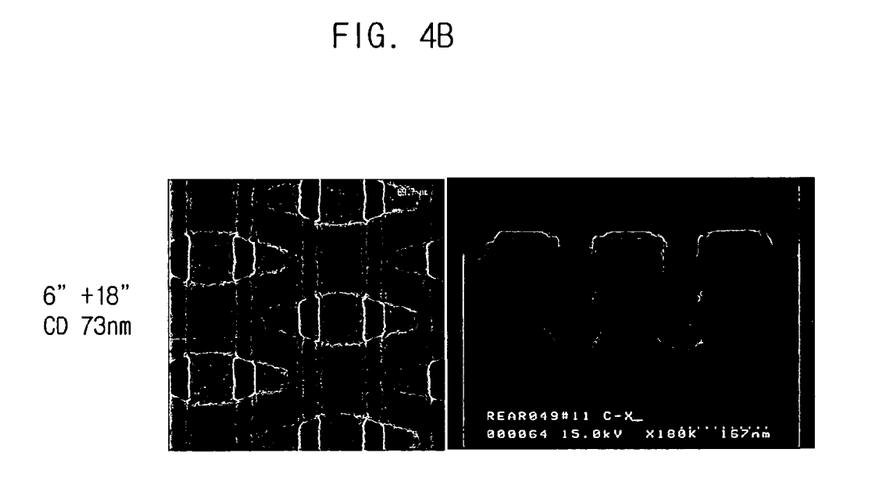

FIGS. 4A and 4B illustrate micrographic views of ball patterns after a spacer etching process and a second recess gate etching process are performed under certain conditions. The certain conditions include performing the spacer etching process using approximately 68% of overetching, and performing the second recess gate etching process using an etch time of approximately 15" and 18". Furthermore, the results are derived after additionally performing a post treatment. Conditions of the post treatment include 50 Ar/F $O_2$/20". Tables 4 and 5 show CDs of the ball patterns shown in FIG. 4A and 4B in detail.

TABLE 4

| (6" + 15") + post treatment | B | C | T | Avg |
|---|---|---|---|---|
| Top CD | 73 | 70 | 76 | 73 |
| Neck Depth | 1,264 | 1,254 | 1,192 | 1,237 |
| Depth | 2,068 | 2,026 | 2,054 | 2,049 |
| Ball CD | 114 | 108 | 118 | 113 |

TABLE 5

| (6" + 18") + post treatment | B | C | T | Avg |
|---|---|---|---|---|
| Top CD | 67 | 69 | 71 | 69 |
| Neck Depth | 1,222 | 1,275 | 1,157 | 1,218 |
| Depth | 2,101 | 2,143 | 2,122 | 2,122 |
| Ball CD | 122 | 120 | 127 | 123 |

Referring to Tables 4 and 5, CDs of the ball pattern increase as the etch time of the second recess gate etching process lengthens.

Comparisons between Tables 2 and 4, and Tables 3 and 5 show that the CD of the ball patterns and the total depth of the recess gate patterns both increase as the overetching is increased during the spacer etching process and as the post treatment is additionally performed.

Referring to FIGS. 4A and 4B, performing the post treatment results in more precisely formed ball patterns (refer to the dotted circles.) Also, the CD of the ball patterns is larger when the etch time of 18" is applied (73 nm) than when the etch time of 15" (71 nm) is applied.

For reference, a second recess gate etching process of a typical method generally uses a gas including $CF_4$ and $O_2$. When forming ball patterns according to the typical method, polymers formed on a chamber surface may cause a partial failure in forming the rounded shape of the ball patterns. Thus, reproducibility may be decreased.

This embodiment and the typical method use different mixture of gases during the second recess gate etching process. That is, the typical method uses a gas including $CF_4$ and $O_2$, and this embodiment uses a gas including $Cl_2$/HBr/$SF_6$/$O_2$. Using the gas including $Cl_2$/HBr/$SF_6$/$O_2$ allows easily forming ball patterns with improved reproducibility while performing an isotropic etching.

Consistent with this embodiment, the second recess gate etching process includes using a pressure ranging from approximately 20 mT to approximately 50 mT and a chamber temperature ranging from approximately 30° C. to approximately 70° C. Only the top power is supplied (the bottom power is not supplied) to allow performing of easier isotropic etching and forming ball patterns with improved precision. The top power, i.e., source power, is supplied, and the bottom power, i.e., bias power, is not supplied in this embodiment. The top power ranging from approximately 300 W to approximately 500 W is used during the second recess gate etching process.

While the present invention has been described with respect to the disclosed embodiments, it will be apparent to those skilled in the art that various changes and modifications may be made without departing from the spirit and scope of the invention as defined in the following claims.

What is claimed is:

1. A method of fabricating a recess channel in a semiconductor device, comprising:
   forming a hard mask pattern over a substrate;
   etching the substrate using the hard mask pattern to form first recesses;
   forming an insulation layer over the hard mask pattern and the first recesses;
   etching the insulation layer to form spacers on sidewalls of the first recesses and on sidewalls of the hard mask pattern;
   etching the substrate below the first recesses to form second recesses using a sulfur fluoride containing gas mixture by using the spacers and the hard mask pattern as an etch barrier; and
   removing the hard mask pattern and the spacers,
   wherein etching the substrate below the first recesses further comprises performing a post treatment using a mixed gas including tetrafluoromethane ($CF_4$)/$O_2$/nitrogen trifluoride ($NF_3$) /helium (He)/argon (Ar).

2. The method of claim 1, wherein etching the substrate below the first recesses further comprises etching using a sulfur fluoride containing gas mixture comprising sulfur hexafluoride ($SF_6$), chlorine ($Cl_2$), hydrogen bromide (HBr), and oxygen ($O_2$).

3. The method of claim 2, wherein etching the substrate below the first recesses further comprises etching using a sulfur fluoride containing gas mixture having a ratio of the $Cl_2$ to the HBr of approximately 3:1.

4. The method of claim 2, wherein etching the substrate below the first recesses further comprises etching using a flow rate of $SF_6$ in the sulfur fluoride containing gas mixture ranging from approximately 3 sccm to approximately 20 sccm, and using a flow rate of $O_2$ in the sulfur fluoride containing gas mixture ranging from approximately 1 sccm to approximately 20 sccm.

5. The method of claim 2, wherein etching the substrate below the first recesses further comprises etching in-situ in the same apparatus used for etching the insulation layer to form spacers; and wherein etching further comprises using a pressure ranging from approximately 20 mT to approximately 50 mT, and using a chamber temperature ranging from approximately 30° C. to approximately 70° C., and supplying a top power.

6. The method of claim 5, wherein etching the substrate below the first recesses further comprises etching with the top power ranging from approximately 100 W to approximately 400 W.

7. The method of claim 6, wherein the post treatment includes an isotropic etching.

8. The method of claim 1, wherein performing the post treatment isotropic etching comprises performing the isotropic etching on the substrate for an eteh thickness ranging from approximately 50 Å to approximately 100 Å.

9. The method of claim 1, wherein forming an insulation layer over the hard mask pattern and the first recesses further comprises forming the insulation layer at a temperature ranging from approximately 700° C. to approximately 1,000° C.

10. The method of claim 9, wherein forming an insulation layer over the hard mask pattern and the first recesses further comprises forming an insulation layer comprising an oxide-based layer using one of a furnace method and a chemical vapor deposition (CVD) method.

11. The method of claim 10, wherein forming the insulation layer further comprises controlling the insulation layer to have step coverage ranging from approximately 70% to approximately 100%.

12. The method of claim 1, wherein forming the first recesses further comprises forming using a gas comprising at least one gas selected from $Cl_2$, HBr, $SF_6$, or using a gas comprising $O_2$ and at least one gas selected from $Cl_2$, HBr, and $SF_6$.

13. The method of claim 12, wherein etching the substrate to form first recesses further comprises etching the first recesses to a depth two times larger than the depth of the second recesses.

14. The method of claim 1, wherein forming the hard mask pattern further comprises forming a stack structure including an oxide-based layer and an amorphous carbon layer.

15. The method of claim 1, wherein etching the substrate to from first recesses further comprises etching the first recesses to have a substantially vertical profile, and wherein etching the substrate below the first recesses to form second recesses further comprises etching the second recesses to have a substantially curvature profile.

16. A method of fabricating a recess channel in a semiconductor device, comprising:
forming a hard mask pattern including an amorphous carbon layer over a substrate;
etching the substrate to form a neck pattern using the hard mask pattern;
forming an oxide-based layer over the hard mask pattern and the neck pattern;
etching the oxide-based layer to form spacers on sidewalls of the neck pattern and sidewalls of the hard mask pattern;
etching the substrate below the neck pattern to form a ball pattern using a gas mixture including chlorine ($Cl_2$), hydrogen bromide (HBr), sulfur hexafluoride ($SF_6$), oxygen ($O_2$) by using the spacers and the hard mask pattern as an etch barrier; and
removing the hard mask pattern and the spacers,
wherein etching the substrate below the neck pattern further comprises performing a post treatment using a mixed gas including tetrafluoromethane ($CF_4$)/$O_2$/nitrogen trifluoride ($NF_3$)/helium (He)/argon (Ar).

17. The method of claim 16, wherein etching the substrate below the neck pattern further comprises etching using a gas mixture having a ratio of the $Cl_2$ gas to the HBr gas of approximately 3:1.

18. The method of claim 17, wherein etching the substrate below the neck pattern further comprises using a flow rate of SF6 in the gas mixture ranging from approximately 3 sccm to approximately 20 sccm, and using a flow rate of $O_2$ in the gas mixture ranging from approximately 1 sccm to approximately 20 sccm.

19. The method of claim 18, wherein etching the substrate below the neck pattern further comprises etching in-situ in the same apparatus used for etching the oxide-based layer to form spacers on sidewalls of the neck pattern and sidewalls of the hard mask pattern, and wherein etching further comprises using a pressure ranging from approximately 20 mT to approximately 50 mT, and using a chamber temperature ranging from approximately 30° C. to approximately 70° C., and supplying a top power.

20. The method of claim 19, wherein etching the substrate below the neck pattern further comprises supplying the top power ranging from approximately 100 W to approximately 400 W.

21. The method of claim 19, wherein the post treatment includes an isotropic etching.

22. The method of claim 16, wherein etching further comprises performing the post treatment etching on the substrate for an etch thickness ranging from approximately 50 Å to approximately 100 Å.

23. The method of claim 16, wherein forming the oxide-based layer further comprises forming the oxide-based layer at a temperature that does not cause deformation of the hard mask pattern, the temperature ranging from approximately 700° C. to approximately 1,000° C.

24. The method of claim 23, wherein forming the oxide-based layer further comprises controlling the oxide-based layer to have step coverage ranging from approximately 70% to approximately 100%.

25. The method of claim 19, wherein etching the substrate to form a neck pattern further comprises using a gas comprising at least one gas selected from $Cl_2$, HBr, $SF_6$, or using a gas comprising $O_2$ and at least one gas selected from $Cl_2$, HBr, and $SF_6$.

26. The method of claim 25, wherein etching further comprises etching the neck pattern to a depth two times larger than the depth of the ball pattern.

* * * * *